United States Patent [19]
Carlson et al.

[11] Patent Number: 4,541,035
[45] Date of Patent: Sep. 10, 1985

[54] LOW LOSS, MULTILEVEL SILICON CIRCUIT BOARD

[75] Inventors: Richard O. Carlson; Homer H. Glascock, II; James A. Loughran; Harold F. Webster, all of Scotia, N.Y.

[73] Assignee: General Electric Company, Schenectady, N.Y.

[21] Appl. No.: 635,697

[22] Filed: Jul. 30, 1984

[51] Int. Cl.³ ............................................. H05K 1/14
[52] U.S. Cl. ................................. 361/414; 174/68.5; 361/395; 361/413
[58] Field of Search ............... 174/68.5; 361/395, 413, 361/414

[56] References Cited
U.S. PATENT DOCUMENTS

| | | | |
|---|---|---|---|
| 3,148,310 | 9/1964 | Feldman | 174/68.5 X |
| 3,390,012 | 6/1968 | Haberecht | 174/68.5 X |
| 3,520,052 | 7/1970 | Hoffman | 361/414 X |
| 3,553,533 | 1/1971 | Haberecht | 361/414 X |
| 3,602,635 | 8/1971 | Romankiw | 174/68.5 |
| 3,917,983 | 11/1975 | Kuronen | 361/414 |
| 4,225,900 | 9/1980 | Ciccio et al. | 361/414 X |
| 4,394,712 | 7/1983 | Anthony | 361/395 X |
| 4,437,109 | 3/1984 | Anthony et al. | 357/68 |

OTHER PUBLICATIONS

McIntosh et al., Packaging of Integrated Circuits, IBM Tech. Disc. Bull., V. 15, #6, Nov. 1972, pp. 1977 to 1980.
Ho et al., Multiple LSI Silicon Chip Modules with Power Busee Composed of Laminated Silicon Sheets with Metallized Upper and Lower Surfaces, IBM Tech. Discl. Bull., V. 22, No. 8A, Jan. 1980, pp. 3410 & 3411.
Patent Application Ser. No. 641,080, filed on Aug. 15, 1984.
T. R. Anthony, "Diodes Formed by Laser Drilling and Diffusion", J. App. Phys., vol. 53, (Dec. 1982), pp. 9154-9164.
T. R. Anthony, "Forming Electrical Interconnections through Semiconductor Wafers", J. Appl. Phys., vol. 52, (Aug. 1981), pp. 5340-5349.
T. R. Anthony, "Drilled, Diffused Diodes", General Electric Report No. 82,CRD 274, (Oct. 1982), pp. 1-17, plus summary page.
T. R. Anthony et al., "The Reverse Drilling of Transparent Materials", General Electric Report No. 81 CRD 073, (Apr. 1981), pp. 1-7, plus summary page.
T. R. Anthony, "Interplantation of Feedthroughs in Semiconductor Wafers by Double-Sided Sputtering and Through-Hole Electroplating", General Electric Report No. 81, CRD 070, (Apr. 1981), pp. 1-10 plus summary page.
T. R. Anthony, "The Random Walk of a Drilling Laser Beam", General Electric Report No. 79, CRD 210, (Oct. 1979), pp. 1-6 plus summary page.
T. R. Anthony, "Forming Feedthroughs in Laser—Drilled Holes in Semiconductor Wafers by Double--Sided Sputtering", IEEE Transactions on Components, Hybrids and Manufacturing Technology, vol. 1, CHMT-5, No. 1, (Mar. 1982), pp. 171-180.
C. Mead et al., Introduction to VLSI Systems, Reading, Mass., Addison-Wesley Publishing Co., (1980), pp. 79-81 and Plates 1-8.

Primary Examiner—R. R. Kucia
Attorney, Agent, or Firm—Charles E. Bruzga; James C. Davis, Jr.; Marvin Snyder

[57] ABSTRACT

A silicon circuit board incorporates multiple levels of patterned conductors. First level upper and lower patterned conductors are situated on an insulation-coated, monocrystalline silicon substrate. Upper and lower, high resistivity, polycrystalline silicon layers, in turn, are situated on the first level upper and lower patterned conductors, respectively. Second level upper and lower patterned conductors are situated over the upper and lower polycrystalline silicon layers. Further levels of patterned conductors in the circuit board may be provided by iteratively forming on the board polycrystalline silicon layers and patterned conductors. Conducting feedthroughs in the circuit board provide electrical communication between various patterened conductors.

8 Claims, 2 Drawing Figures

LOW LOSS, MULTILEVEL SILICON CIRCUIT BOARD

BACKGROUND AND SUMMARY OF THE INVENTION

The present invention relates to a low electrical loss circuit board using a silicon substrate and incorporating multiple levels of patterned conductors.

The use of monocrystalline silicon has been proposed as a circuit board substrate on which circuit conductors are formed and silicon semiconductor chips are mounted and interconnected by the circuit conductors. This is because the monocrystalline silicon substrate is matched in thermal expansion properties to the silicon chips mounted thereon and exhibits a high thermal conductivity, beneficial in removing heat from the chips mounted thereon. A key shortcoming of such monocrystalline silicon circuit boards resides in the fact that readily-available and reasonably-priced monocrystalline silicon typically has a resistivity limited to the range of about $10^{-2}$ to $10^3$ ohm-cm. This results in high dielectric and conduction losses for signals transmitted on circuit conductors of the circuit board, resulting in undesirable signal attenuation. The dielectric and conduction losses are particularly acute for signals above about 1 megahertz in frequency.

It, accordingly, is an object of the present invention to provide a silicon circuit board in which dielectric and conduction losses are minimal.

A further object of the invention is to provide a silicon circuit board incorporating multiple levels of patterned conductors.

Another object of the invention is to provide a silicon circuit board in which an inner level of patterned conductors constitutes ground planes for an outer level of patterned conductors.

The objects of the invention are achieved in a silicon circuit board, which, in preferred form, includes an inner substrate layer of monocrystalline silicon, with upper and lower insulative layers disposed on upper and lower surfaces of the substrate layer, respectively. A first, inner level of upper and lower patterned conductors is provided on the upper and lower insulative layers, respectively, these layers preferably constituting ground planes for a second, outer level of patterned conductors. Provided on the first level upper and lower patterned conductors are upper and lower layers of high resistivity, polycrystalline silicon, respectively, over which are provided second level upper and lower patterned conductors, respectively. To provide electrical communication between the first and second level upper conductor patterns, upper conducting feedthroughs are provided which extend through the upper polycrystalline silicon layer; and to provide electrical communication between the first and second level lower patterned conductors, lower conducting feedthroughs are provided which extend through the lower polycrystalline silicon layer.

A third level of patterned conductors may be incorporated into the silicon circuit board of the invention by forming further upper and lower high resistivity, polycrystalline silicon layers on the second level upper and lower patterned conductors, respectively, followed by formation on these further polycrystalline silicon layers of a third level of upper and lower patterned conductors, respectively. The printed-circuit board may incorporate still further levels of patterned conductors by iteratively providing additional polycrystalline silicon layers and additional levels of patterned conductors arranged in the foregoing sequence.

BRIEF DESCRIPTION OF THE DRAWINGS

The features of the invention deemed to be novel are defined in the appended claims. The invention itself, however, both as to organization and method of operation, together with further objects and advantages thereof, may be best understood with reference to the following description when read in conjunction with the accompanying drawings, in which:

DESCRIPTION OF THE PREFERRED EMBODIMENTS

Figure 1:
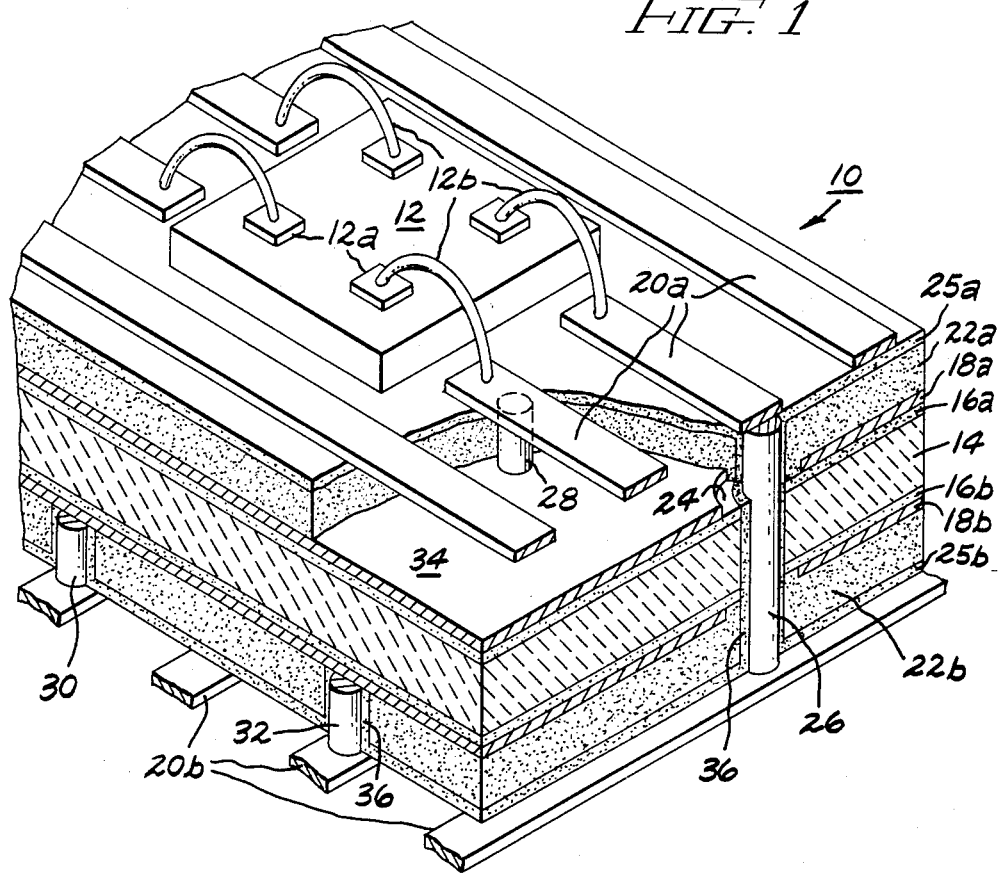
FIG. 1 is a three-dimensional view partially in cross-section and partially cut away of an exemplary circuit board of the present invention.

FIG. 1 illustrates an exemplary version of a low dielectric loss, multilevel, silicon printed-circuit board 10 of the present invention, a schematically-illustrated semiconductor chip 12 being mounted thereon. Circuit board 10 includes an inner substrate layer 14 of monocrystalline silicon, which, beneficially, is closely matched in thermal expansion properties to silicon semiconductor chip 12 and, further, which has a high thermal conductivity, useful in removing of heat from semiconductor chip 12. Substrate layer 14 preferably is of high resistivity silicon, a typical resistivity being in the range from about $10^2$ to $10^3$ ohm-cm. To further increase the effective resistivity of circuit board 10, insulative layers 16a and 16b of very high resistivity material are formed on upper and lower surfaces of substrate layer 14, respectively. A thermally-grown oxide of substrate layer 14, particularly when formed in the presence of steam, is the preferred material for layers 16a and 16b. A typical thickness for such oxide layers 16a and 16b is about 1.0 micron. Other high resistivity insulative materials may be used to implement layers 16a and 16b, however, examples being aluminum nitride, chemical vapor-deposited silicon dioxide, and semi-insulating polycrystalline oxygen-doped silicon (SIPOS).

A first, inner level of patterned conductors 18a and 18b are respectively formed on insulative layers 16a and 16b. Standard semiconductor metallization technology is suitably used in the formation of patterned conductors 18a and 18b, these conductors preferably comprising aluminum or copper, although other metals may be used, such as tungsten, molybdenum, platinum, palladium, or gold, and other conductive material may be used, such as highly-coonductive metal silicides.

Dielectric separation between the first, inner level of patterned conductors 18a and 18b and a second, outer level of patterned conductors 20a and 20b is achieved by formation of polycrystalline silicon layers 22a and 22b on conductor patterns 18a and 18b, respectively, and also on selected portions of insulative layers 16a and 16b, respectively, which are preferably not overlain by conductor patterns 18a or 18b (one such uncovered portion of insulative layer 16a comprising portion 24, for example).

Polycrystalline silicon layers 22a and 22b are preferably free of conductivity-determining dopants whereby circuit board 10 benefits from the high resistivity of the undoped polycrystalline silicon, which is about $10^6$ ohm-cm. The use of polycrystalline silicon for layers 22a and 22b is additionally beneficial since such material is matched in thermal expansion properties to silicon chip 12 and also has a high thermal conductivity.

The outer level conductor patterns 20a and 20b, preferably the same in composition as the inner level of patterned conductors 18a and 18b, are disposed over polycrystalline silicon layers 22a and 22b, respectively, typically, but not necessarily, being separate therefrom by second level upper and lower insulative layers 25a and 25b, respectively, which preferably comprise thermally-grown oxide of the adjacent polycrystalline layers.

Exemplary silicon chip 12 with bonding pads 12a thereon is mounted on insulation layer 25a of circuit board 10 by thermally-conducting epoxy, for example, and is interconnected to upper patterned conductors 20a, such as with conventional wire bonds 12b.

Patterned conductors 20a may conveniently be oriented orthogonally to patterned conductors 20b, as shown, with conducting feedthroughs, such as feedthrough 26, extending through circuit board 10 and interconnecting selected portions of patterned conductors 20a and 20b. Conducting feedthrough 26 in one form is dielectrically separated from the inner level of patterned conductors 18a and 18b by maintaining separation between feedthrough 26 and these patterned conductors, such as in the vicinity of portion 24 of upper insulative layer 16a.

A conducting feedthrough 28 interconnects the first level upper patterned conductors 18a and a selected portion of the second level upper patterned conductors 20a, conducting feedthrough 28 being illustrated with the normally-adjoining polycrystalline layer 22a (and insulative layer 36) cut away to more clearly portray the feedthrough. Similarly, conducting feedthroughs 30 and 32 interconnect selected portions of lower patterned conductors 20b to lower patterned conductor 18b.

In the most preferred form of circuit board 10, inner patterned conductors 18a and 18b each comprise ground planes for outer patterned conductors 20a and 20b, respectively. This is particularly desirable where signals on outer conductors 20a and 20b have frequencies exceeding about 1 Megahertz. This minimizes signal attenuation in outer conductors 20a and 20b. To constitute respective ground planes for outer patterned conductors 20a and 20b, inner patterned conductors 18a and 18b each are relatively large in area, for example, in area 34 of conductor 18a, compared with the elongated portions of outer patterned conductors 20a and 20b, in accordance with known criteria in the art.

With inner patterned conductors 18a and 18b comprising ground planes for outer patterned conductors 20a and 20b, a desired characteristic impedance of the outer conductors may be achieved. This is accomplished through the selection of the width of the elongated portions of the outer conductors 20a and 20b and the thickness of polycrystalline layers 20a and 20b in accordance with known criteria in the art.

In the fabrication of circuit board 10, insulative layers 16a and 16b are first formed on substrate layer 14, and patterned conductors 18a and 18b are then formed on these insulative layers, respectively, with polycrystalline silicon layers 22a and 22b then being formed on patterned conductors 18a and 18b, respectively(and on exposed portions of insulative layers 16a and 16b). Fabrication details for the foregoing layers will be apparent from the above description of these layers. Fabrication of conducting feedthroughs 26, 28, 30, and 32 proceeds as presently discussed.

The thus-formed circuit board 10 is next bored to provide holes in which the various conducting feedthroughs are to be implemented. A preferred technique for boring the holes comprises laser drilling, which rapidly produces small-diameter feedthrough bores, for example in the range of 20 to 100 microns, such small-diameter feedthrough bores beneficially permitting the elongated portions of patterned conductors 20a and 20b to be densely spaced together. A suitable laser drilling technique is described in an article by TR Anthony, entitled "Diodes Formed by Laser Drilling and Diffusion", Journal of Applied Physics, Vol. 53 (December 1982), pages 9154–9164, the entirety of which is incorporated herein by reference. While the laser drilling technique of the Anthony article is directed to boring feedthrough holes in monocrystalline silicon, the Anthony drilling technique is equally applicable to drilling through polycrystalline silicon.

In the formation of conducting feedthrough 26, laser drilling of circuit board 10 is suitably utilized to bore through multiple layers of the board including polycrystalline silicon layer 22a, insulative layer 16a (of silicon dioxide, for example), monocrystalline silicon substrate 14, insulative layer 16b, and polycrystalline silicon layer 22b, but ordinarily not through inner patterned conductors 18a and 18b, which are preferably patterned so as to be dielectrically spaced from conducting feedthrough 26 (e.g., at portion 24 of insulative layer 16a). If, however, patterned conductors 18a and 18b have not been patterned to provide spacing from conducting feedthrough 26, laser drilling of circuit board 10 proceeds (as described in the Anthony article, for example), until the patterned conductors are reached by the laser beam. The patterned conductors thereupon constitute automatic drilling stops, at least where they comprise aluminum or copper, since such metals resist laser drilling. Conductors 18a and 18b can be penetrated, however, by an increase in laser power, a doubling or greater increase typically being sufficient.

In the formation of conducting feedthroughs 28, 30 and 32, laser drilling of polycrystalline layers 22a and 22b suitably proceeds as described in the Anthony article, with patterned conductors 18a and 18b advantageously being used as automatic drilling stops.

Once circuit board 10 has been laser drilled to provide feedthrough bores for conducting feedthroughs 26, 28, 30, and 32, the entire, thus-formed circuit board 10 (not yet including outer patterned conductor 20a and 20b) is preferably then subjected to an isotropic etchant, for removing thermally-damaged silicon material in the various bores and any accumulation of semiconductor material at the upper and lower entrances to the feedthrough bores. A suitable isotropic etchant that may be used is a wet chemical etchant comprising 6 parts nitric acid, 4 parts acetic acid, and 1 part hydrofluoric acid. For 50-micron bores, etching suitably proceeds until the various bores have been enlarged to by about 100 mircons or more, at which point the unwanted semiconductor material in the feedthrough bores is substantially removed, rendering the bores more uniformly cylindrical, and unwanted accumulation of semiconductor material at the bore entrances is substantially removed.

While laser drilling is the preferred technique for boring feedthrough bores in circuit board 10, other techniques may be employed, such as drilling by mechanical or ultrasonic means.

Once suitable feedthrough bores have been formed, maximum dielectric separation between adjacent conducting feedthroughs is then preferably achieved by oxidizing the various bores, steam oxidation being preferred. A resultant buildup of silicon dioxide 36 in the bores of about 1 micron is preferred. Since this oxidation step is typically performed by exposing the entire circuit board 10 to steam at an elevated pressure, upper and lower insulative layers 25a and 25b are simultaneously formed on polycrystalline layers 22a and 22b, respectively. The bores are then partially or completely filled with a conducting medium, various techniques for accomplishing this being described, for example, in an article by T. R. Anthony, entitled "Forming Electrical Interconnections Through Semiconductor Wafers", Journal of Applied Physics, Vol. 52 (August 1981), pages 5340–5349, the entirety of which is incorporated herein by reference. This article, in particular, describes several techniques for the formation of electrical interconnections through small bores in silicon-on-sapphire semiconductor wafers, generally applicable to the present silicon circuit board 10 (FIG. 1), including the techniques of capillary wetting, wedge extrusion, electroless plating, double-sided sputtering, abd through-hole electroplating.

In more detail, the capillary wetting and wedge extrusion techniques as described in the Anthony article are techniques in which an organic resinous liquid containing conductive particles is introduced into the various (preferably oxidized) bores, the liquid, when cured, forming a permanent electrical conductor throughout the length of each bore. For bores that penetrate entirely through circuit board 10 (e.g. the bore for conducting feedthrough 26), the effectiveness of the foregoing techniques is preferably enhanced through the use of hydraulic pressure to force the conductive liquid into the bores or the use of vacuum to aid in drawing into the bores the conductive liquid.

Two further techniques for forming conducting feedthrough in (preferably oxidized) bores comprise further capillary wetting techniques. One technique involves the use of a liquid organometallic compound containing metal ions, which may be filled with conductive particles and which, when cured, forms metallic conducting feedthroughs. Suitable organometallic compounds are known as liquid brites in the ceramic and glassware industries, the liquid brites being used for pictorial decoration of ceramic and glassware articles. A second, capillary wetting technique involves the use of molten metal, such as aluminum, which is molten to such a degree as to be flowable and which, when cooled, forms conducting feedthroughs. The effectiveness of these capillary wetting techniques may be enhanced through the use of hydraulic pressure or vacuum to assist in the transport into the bores, by capillary action, of the respective, liquid conductive mediums.

A further technique of forming conducting feedthroughs, once bores for the conducting feedthroughs have been formed, is to heavily dope the inner surfaces of the bores with a conductivity-determining dopant. This technique is discussed in detail in the above-referenced Anthony article entitled "Diodes Formed by Laser Drilling and Diffusion".

Figure 2:
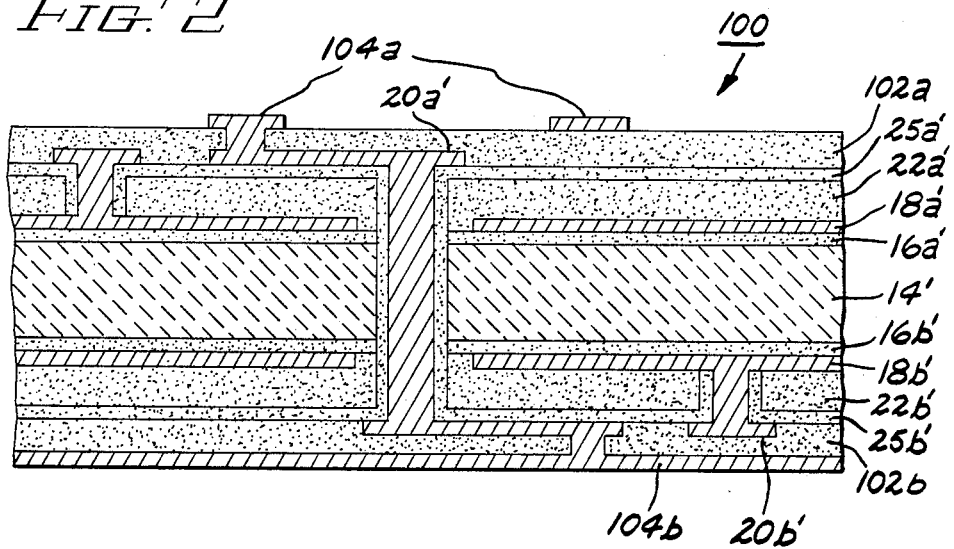
FIG. 2 is a cross-sectional view of a further circuit board of the present invention incorporating an additional level of patterned conductors with respect to the FIG. 1 circuit board.

Illustrated in FIG. 2 is an alternative circuit board 100 incorporating a third level of patterned conductors, one more level than in circuit board 10 (FIG. 1). In circuit board 100, layers corresponding generally to the like-numbered layers of circuit board 10 are layers 14', 16a' and 16b', 18a' and 18b', 22a' and 22b', 20a' and 20b', and 25a' and 25b'. Board 100 further includes upper and lower polycrystalline silicon layers 102a and 102b disposed on second level patterned conductors 20a' and 20b', respectively, and third level upper and lower patterned conductors 104a and 104b disposed on layers 102a and 102b, respectively. Fabrication takes place as described for the circuit board shown in FIG. 1.

More than three levels of patterned conductors can be provided in a circuit board according to the present invention. However, a limiting factor to the number of acceptable levels is excessive warping of the circuit board due to the heat encountered in formation of the various polycrystalline silicon layers and in the steam oxidation steps.

A further technique of achieving a greater number of levels of patterned conductors than in circuit board 10 of FIG. 1 is to stack together two circuit boards 10, with the adjacent patterned conductors being configured as mirror-image patterns of each other. The adjacent patterned conductors are suitably bonded together by soldering or thermo-compression difffusion bonding, by way of example.

The foregoing describes silicon printed-circuit boards with minimal dielectric and conduction losses. The circuit boards incorporate multiple levels of patterned conductors, selected levels of which may beneficially constitute ground planes for adjacent patterned conductors.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. A low dielectric loss, multilevel silicon circuit board, comprising:
   (a) an inner substrate layer of monocrystalline silicon;
   (b) upper and lower insulative layers on upper and lower surfaces of said substrate layer, respectively;
   (c) first level upper and lower patterned conductors on said upper and lower insulative layers, respectively;
   (d) upper and lower layers of polycrystalline silicon on said upper and lower first level patterned conductors, respectively;
   (e) second level upper and lower patterned conductors over said upper and lower layers of polycrystalline silicon, respectively; and
   (f) upper and lower conducting feedthroughs extending through said upper and lower polycrystalline silicon layers, respectively, said upper conducting feedthrough interconnecting said upper first and second level patterned conductors and said lower conducting feedthrough interconnecting said lower first and second level patterned conductors.

2. The silicon circuit board of claim 1 further comprising a conducting feedthrough extending fully through the circuit board, interconnecting said second level upper and lower patterned conductors, and being dielectrically separated from said first level upper and lower patterned conductors.

3. The silicon circuit board of claim 2 further comprising an oxide layer surrounding the conducting feedthrough which interconnects said second level upper and lower patterned conductors.

4. The silicon circuit board of claim 1 wherein said upper and lower insulative layers each comprise an oxide of said substrate layer.

5. The silicon circuit board of claim 1 wherein said upper and lower patterned conductors comprise aluminum or copper.

6. The circuit board of claim 1 wherein said first level upper and lower patterned conductors respectively comprise ground planes for said second level upper and lower patterned conductors.

7. The silicon circuit board of claim 1 wherein said upper and lower layers of polycrystalline silicon are substantially free of conductivity-determining dopant.

8. The silicon circuit board of claim 1 further comprising:
 (a) further upper and lower layers of polycrystalline silicon on said further upper and lower patterned conductors, respectively;
 (b) third level upper and lower patterned conductors over said further upper and lower polycrystalline layers, respectively; and
 (c) further upper and lower conducting feedthroughs extending through said further upper and lower polycrystalline silicon layers, respectively, said further upper conducting feedthroughs interconnecting said upper second and third level patterned conductors and said further lower conducting feedthroughs interconnecting said lower second and third level patterned conductors, respectively.

* * * * *